(12) United States Patent
Hayashi

(10) Patent No.: US 7,894,497 B2  
(45) Date of Patent: Feb. 22, 2011

(54) DRIVING CIRCUIT USING PROBABILITY DENSITY FUNCTION

(75) Inventor: Shigeo Hayashi, Yokohama (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 464 days.

(21) Appl. No.: 11/902,965

(22) Filed: Sep. 26, 2007

(65) Prior Publication Data

US 2008/0084904 A1    Apr. 10, 2008

(30) Foreign Application Priority Data

Sep. 26, 2006   (JP) ............................. 2006-261041

(51) Int. Cl.
   *H01S 3/00*   (2006.01)
(52) U.S. Cl. ............... 372/38.01; 372/38.02; 372/38.07
(58) Field of Classification Search ............... 372/38.02, 372/38.01, 38.07
   See application file for complete search history.

(56) References Cited

U.S. PATENT DOCUMENTS 6,151,344 A * 11/2000 Kiely et al. ............... 372/38.02

FOREIGN PATENT DOCUMENTS

| JP | 06-164049 | 6/1994 |
| JP | 09-283848 | 10/1997 |
| JP | 2000-269897 | 9/2000 |
| JP | 2000-332344 | 11/2000 |

* cited by examiner

*Primary Examiner*—Minsun Harvey  
*Assistant Examiner*—Joshua King  
(74) *Attorney, Agent, or Firm*—Venable LLP; Michael A. Sartori; Kyle D. Petaja (57) ABSTRACT

The present invention provides a laser diode driving circuit that enables to precisely control the amplitude of the driving current with suppressing the overshoot and the undershoot appeared in the monitor signal of the optical output from the laser diode. The driving circuit of the invention includes a signal mixer, a comparator, an averaging unit and a current generator. The signal mixer superposes an additional signal on the monitor signal. The amplitude of the additional signal varies in accordance with a preset distribution function. The comparator compares thus superposed signal with a reference level and outputs a binary signal. The averaging unit integrates this binary signal and the current generator provides the driving current based on the averaged binary signal.

10 Claims, 11 Drawing Sheets

DRIVING CIRCUIT USING PROBABILITY DENSITY FUNCTION

CROSS-REFERENCE TO RELATED APPLICATIONS

This application closely relates to an application by the same inventor and the same applicant, the serial number of which is Ser. No. 11/896,597, whole content of which is incorporated herein by reference level.

BACKGROUND OF THE INVENTION

1. Field of the Invention

The present invention relates to a driving circuit of a semiconductor laser diode (hereafter denoted as LD).

2. Related Prior Art

It is quite well known that a driving circuit for the LD controls the driving current based on the photocurrent output from the monitoring photodiode (hereafter denoted as PD) in order to stabilize the output power and the extinction ratio of the signal light output from the LD. Various prior patents has disclosed such driving circuit in which a current-to-voltage conversion of the photocurrent output from the PD generates a monitor signal and a peak hold circuit detects and holds peak levels of the monitor signal. The circuit disclosed in prior patents controls the driving current so as to maintain the peak level thus detected and held to be constant in a preset level.

However, a method to detect and hold the peak level often accompanies with erroneous results when the monitor signal contains noises and an overshoot or undershoot, where the overshoot occurs at a leading edge after long continuous low levels and the level thereof rises higher than the ordinal high level, while, the undershoot occurs at a falling edge after long continuous high levels and the level of the signal falls lower than the ordinal low level. The peak hold circuit has detected and held the overshoot as the peak level of the monitor signal. Accordingly, it is complicated for a conventional driving circuit with the peak hold function to precisely control the driving current based on the true and inherent high level of the monitored signal.

The present invention is, carried out by considering the subjects above, to provide a driving circuit able to precisely control the driving current with suppressing the influence of the overshoot or the undershoot.

BRIEF SUMMARY OF THE INVENTION

One aspect of the present invention is directed to a driving circuit for the LD. The circuit provides a driving current to the LD, where the driving current is controlled, based on a photocurrent output from the PD that monitors an optical output signal from the LD, so as to maintain the output power and the extinction ratio of the optical output to be constant. The driving circuit according to the invention provides a comparator, a signal mixer, a first averaging unit, and a current generator.

The comparator generates a binary signal after comparing the photocurrent with a preset reference level. The signal mixer mixes a superposed signal with one of the photocurrent and the preset reference level. The first averaging unit averages the binary signal output from the comparator to provide a control signal. The current generator generates the driving current based on the control signal output from the averaging unit. The present invention has a feature that the superposed signal has the amplitude with a predetermined distribution such as the Gaussian distribution or the uniform distribution in a voltage range. Accordingly, the binary signal output from the comparator reflects the ratio of the photocurrent with the superposed signal exceeding the preset reference level or the ratio of the preset reference level with the superposed signal exceeding the photocurrent.

Because the binary signal is equivalent to the ratio above explained, the driving circuit may escape from the overshoot and undershoot which is appeared occasionally appeared in the photocurrent and the conventional driving circuit using the peak holding function is not unavoidable therefrom.

The driving circuit may further provide a current-to-voltage converter that converts the photocurrent to a corresponding monitor signal. The signal mixed may mix the superposed signal on the monitor signal and the comparator may compare thus mixed monitor signal with the preset level. The conversion gain of the current-to-voltage converter may be determined from the average of the photocurrent and the average of the monitor signal. The superposed signal may be dynamically amplified based on the conversion gain of the current-to-voltage converter as maintaining the predetermined distribution.

Another aspect of the present invention relates to a method to control the driving current supplied to the LD. The method comprises: (1) preparing a preset reference level, (2) mixing a superposed signal with one of the photocurrent and the preset reference level, (3) comparing the photocurrent to the preset reference level by the comparator to generate a binary signal, (4) averaging the binary signal to generate a control signal, and (5) providing the driving current based on the control signal. A feature of the present invention is that the superposed signal to be mixed with one of the photocurrent and the preset reference level has amplitude with a preset distribution such as the Gaussian distribution and the uniform distribution in a preset range.

Because the invention is thus configured, the binary signal reflects the ratio that the photocurrent mixed with the superposed signal exceeds the preset reference level, or that the preset reference level mixed with the superposed signal exceeds the photocurrent. Thus, the method may be escaped from the influence of the overshoot and undershoot occasionally appeared in the photocurrent, which enables the driving circuit to precisely control the driving current provided to the LD.

BRIEF DESCRIPTION OF DRAWINGS

FIGS. 4A and 4B are diagrams to describe the amplitude distribution of the mixed signal, where FIG. 4A is an example of the monitor signal output from the current-to-voltage converter, while, FIG. 4B shows the amplitude distribution of the mixed signal;

FIG. 6A to FIG. 6C illustrate a case when an inadequate superposed signal is selected, in which FIG. 6A is an example of the monitor signal, FIG. 6B shows the voltage distribution of the high level and FIG. 6C shows the distribution of the low level;

FIG. 7A to FIG. 7C illustrate a case when an adequate signal is selected for the superposed signal, in which FIG. 7A is an example of the monitor signal, FIG. 7B shows the distribution of the high level and FIG. 7C shows the distribution of the low level;

DETAILED DESCRIPTION OF THE INVENTION

Next will describe preferred embodiments of the present invention. In the description of the drawings, the same numerals or symbols refer to the same elements without overlapping explanations.

First Embodiment

Figure 1:
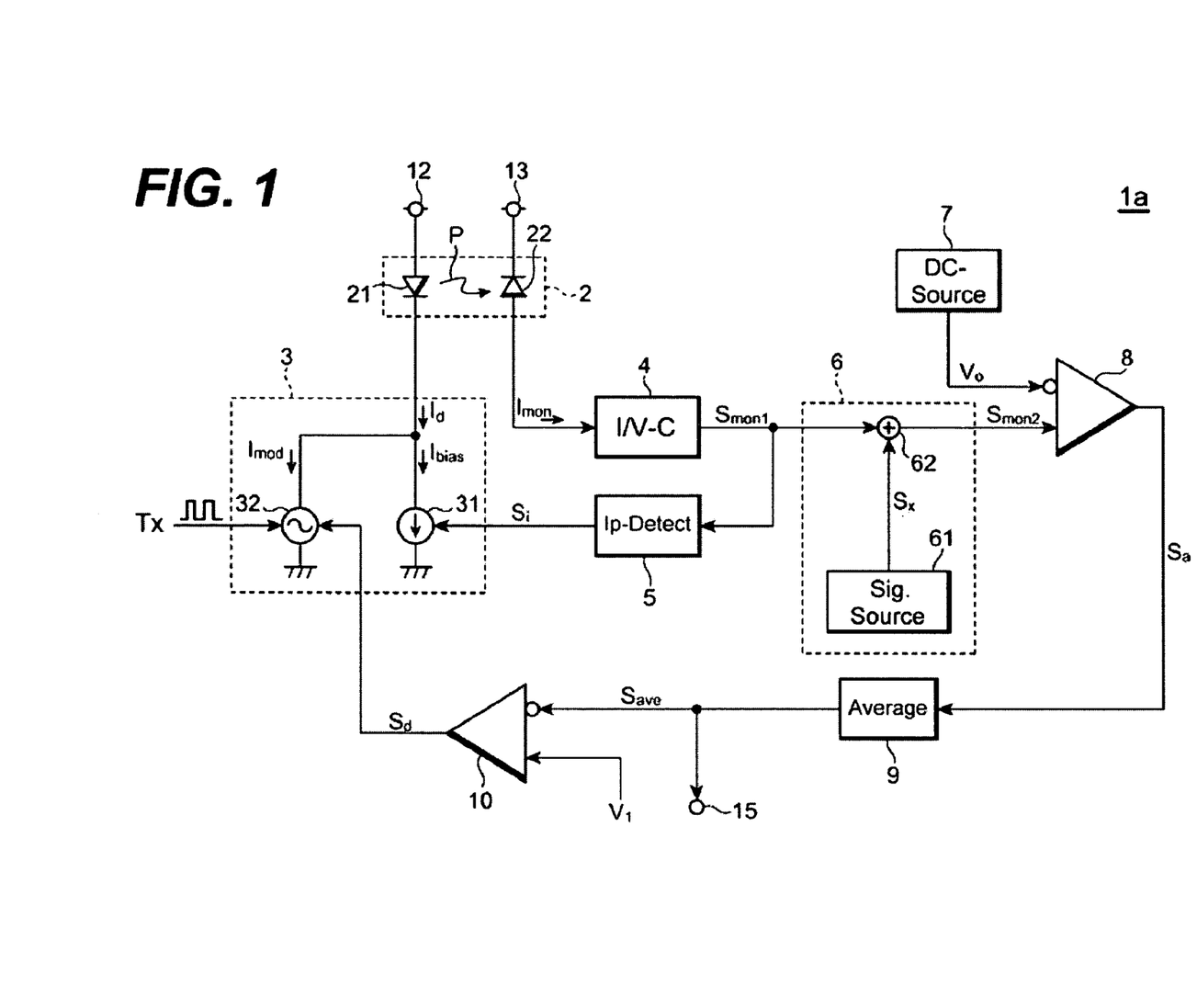
FIG. 1 is a block diagram of a laser driving circuit according to an embodiment of the present invention.

FIG. 1 is a block diagram of a driving circuit for a laser diode as a first embodiment of the present invention. The driving circuit 1a shown in FIG. 1 drives an optical device 2 and constitutes an optical transmitter. The optical device 2 includes a semiconductor laser diode 21 (hereafter denoted as LD) that generates a signal light P and a photodiode 22 (hereafter dented as PD) that monitors the signal light P. The LD 21 generates the signal light P by receiving a driving current Id that includes a modulation current Imod corresponding to a transmission signal Tx applied from the outside of the driving circuit 1a and a bias current Ibias with a direct current mode.

Figures 2A, 2B:
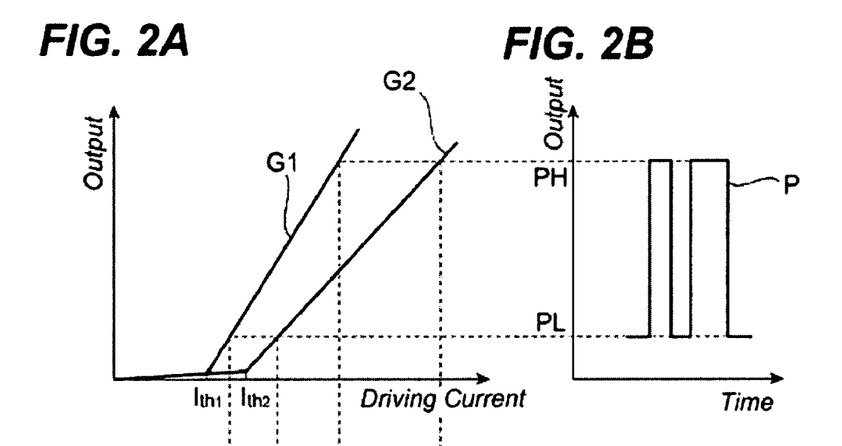
FIG. 2A shows a current to an optical output characteristic of n laser diode.
FIG. 2B shows a typical time chart of the optical output from the LD.

FIG. 2A shows a typical characteristic of the LD 21. The horizontal axis corresponds to the forward current, which is the driving current, of the LD 21, while the vertical axis corresponds to the optical output from the LD 21. The behavior G1 in FIG. 2A is a behavior when the LD 21 operates at a temperature $T_1$ [° C.], while, the behavior G2 corresponds to a case when the LD 21 operates at a temperature $T_2$ [° C.], which is higher than the temperature $T_1$. The symbols $Ith_1$ and $Ith_2$ are the threshold currents of the LD 21 at the operating temperature of $T_1$ and $T_2$, respectively.

Figure 2C:
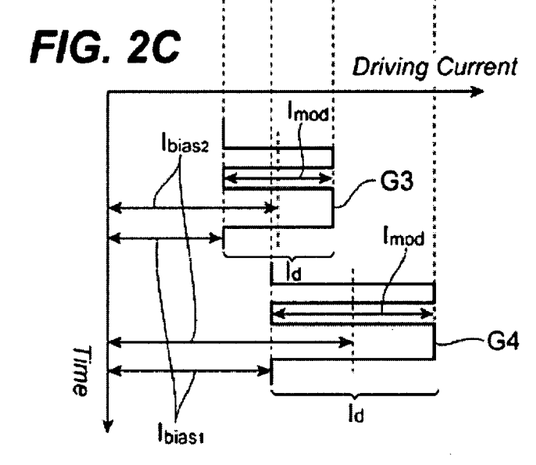
FIG. 2C is a typical example of the driving current to generate the optical output shown in FIG. 2B.
Figure 3:
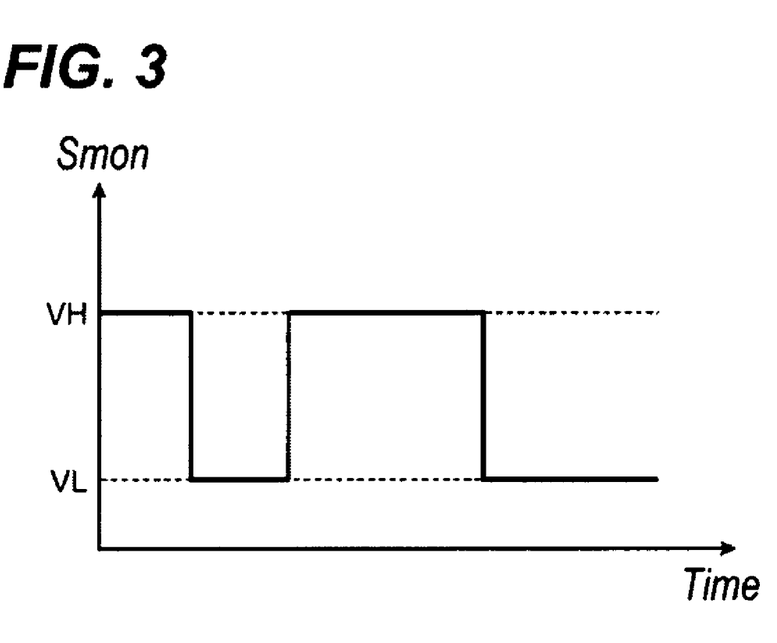
FIG. 3 shows an example of the monitor signal output from the current-to-voltage converter.

FIG. 2B shows the behavior of the signal light P, which alternately changes the lower level output PL and the higher level output PH. FIG. 2C illustrates the driving current Id required for the LD 21 to output the signal light with the lower level PL and the higher level PH shown in FIG. 2B. In FIG. 2C, the behavior G3 shows the driving current Id at the temperature $T_1$, while, G4 corresponds to the current Id at the temperature $T_2$. The symbol $Ibias_1$ in FIG. 2C is the bias current Ibias when the current generator 3 connects to the LD 21 in the DC coupled mode as shown in FIG. 1. The symbol $Ibias_2$ is the current when the current generator 3 connects to the LD 21 in the AC coupled mode. As shown in FIG. 2C, the driving current is a sum of the modulation current Imod and the bias current Ibias.

The output characteristic of the LD 21 strongly depends on the operating temperature thereof. That is, the higher the operating temperature, the greater the threshold current Ith. Accordingly, the bias current $Ibias_1$ ($Ibias_2$) and the modulation current $Imod_1$ ($Imod_2$) are necessary to be adjusted as the temperature, as the behaviors, G3 and G4, in FIG. 2C to maintain the output power and the extinction ratio of the LD 21 constant with respect to the temperature. Therefore, the driving circuit 1a supplies the driving current Id to the LD 21 depending on the transmission signal Tx as adjusting them, the bias current $Ibias_1$ ($Ibias_2$) and the modulation current $Imod_1$ ($Imod_2$) based on the photocurrent Imon generated by the PD 22.

Referring to FIG. 1 again, the driving circuit 1a comprises the current generator 3, a current-to-voltage converter 4, a current detector 5, a signal mixer 6, a constant voltage source 7, two comparators, 8 and 10, an averaging unit 9, and an output terminal 15.

The current generator 3 supplies the driving current Id, which is modulated by the transmission signal Tx, to the LD 21. This current generator 3 includes a bias current source 31 and a modulation current source 32. The bias current source 31 adjusts the forward bias current Ibias, by receiving a signal Si output from the current detector 5, such that the signal Si becomes equal to a reference level value.

The modulation current source 32 adjusts the modulation current Imod that is modulation by the transmission signal Tx, by receiving a signal Sd output from the second comparator 10, such that the signal Sd monotonically increases. Although the embodiment shown in FIG. 1 connects the cathode of the LD 21 to the bias current source 31, the bias current source 31 may be connected between the anode of the LD 21 and power supply 13.

The current-to-voltage converter 4 (hereafter denoted as I/V-C) converts the photocurrent Imon output by the PD 22 into a monitor signal $Smon_1$. The I/V-C 4 may be, what is called, a trans-impedance amplifier or a high-impedance amplifier with a converting resistor in the front end thereof.

The current detector 5 generates a signal Si from the monitor signal $Smon_1$. The signal Si corresponds to an average of the photocurrent Imon. One exemplary configuration of the current detector 5 is an integrating circuit including a resistor and a capacitor.

The signal mixer 6 mixes a superposed signal Sx with the monitor signal $Smon_1$. The superposed signal Sx has a Gaussian distribution or a uniform distribution in the amplitude thereof, that is, the superposed signal may be a white noise that includes the uniform distribution in the amplitude and the frequency components thereof. The signal mixer 6 includes the signal generator 61 and a mixer 62, the latter outputs a mixed signal $Smon_2$ that superposes the superposed signal Sx on the monitor signal $Smon_1$.

The constant voltage source 7 generates a reference level $V_0$ provided to the comparator 8. Although the present embodiment generates the reference level $V_0$ at the constant voltage source 7, the outside of the driving circuit 1a may provide the reference level $V_0$.

The comparator 8 generates a binary signal Sa by comparing the mixed signal $Smon_2$ with the reference level $V_0$. The non-inverting input of the comparator 8 is connected to the I/V-C 4 via the mixer 62, while, the inverting input of the comparator 8 receives the reference level $V_0$. When the mixed signal $Smon_2$ exceeds the reference level $V_0$, the comparator outputs, for instance, 1V as the high level. On the other hand, it outputs, for instance, 0 V as the low level when the mixed signal $Smon_2$ is less than the reference level $V_0$.

The averaging unit 9 integrates the binary signal Sa output form the first comparator 8 and may include a resistor and a capacitor to constitute an integration circuit. The output terminal 15 is connected to the output of the averaging unit 9, which enables to extract a signal Save by the outside of the driving circuit 1a.

The other comparator 10 compares the averaged signal Save provided from the averaging unit 9 with the second reference level $V_1$ to generate a differential signal Sd. The inverting input of the second comparator 10 is brought to the outside of the circuit to receive the second reference level $V_1$. The signal Sd corresponds to a difference between the averaged signal Save with the second reference level $V_1$ and is sent to the modulation current source 32.

Next will describe a function of the driving circuit 1a. The description below assumes that the high level VH of the monitor signal $Smon_1$ corresponds to the high level PH of the optical output, while, the low level VL of the monitor signal $Smon_1$ corresponds to the low level PL of the optical output, which is referred in FIG. 2B. The target optical output is denoted as $PH_0$ for the high level of the transmission signal Tx, and the monitor signal $Smon_1$ becomes a target high level $VH_0$ for the target high level $PH_0$, while, the other target optical output is denoted as $PL_0$ for the low level of the transmission signal Tx, and the monitor signal $Smon_1$ becomes the target low level $VL_0$ for the level $PL_0$.

Further assuming that the first reference level $V_0$ provided to the comparator 8 is equal to the target low level $VH_0$ of the monitor signal $Smon_1$ and the binary signal Sa becomes 1 V when the mixed signal $Smon_2$ exceeds the first reference level $V_0$, which is equal to the target low level $VH_0$, while, it becomes 0 V when the mixed signal $Smon_2$ is less than the first reference level $V_0$. The analysis provided below further assumes that the mark density ratio of the transmission signal Tx is ½ and the monitor signal $Smon_1$ shows no leading edge relaxation and no falling edge relaxation, that is, the monitor signal $Smon_1$ shows an instantaneous transition from the low level to the high level or from the high level to the low level.

Figure 4A:
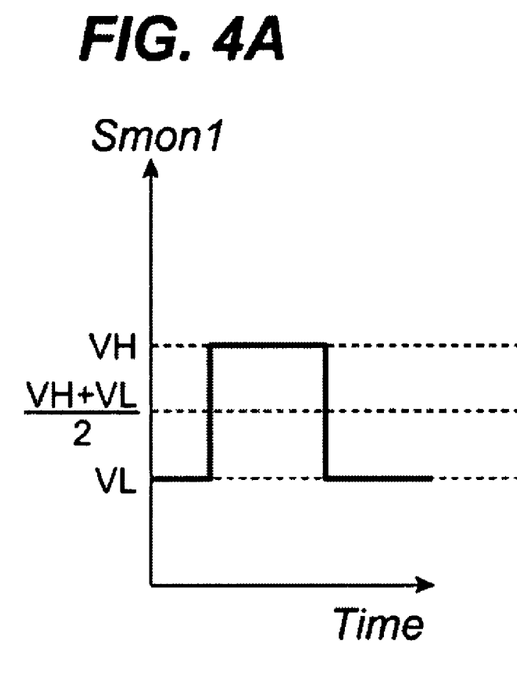
Figure 4B:
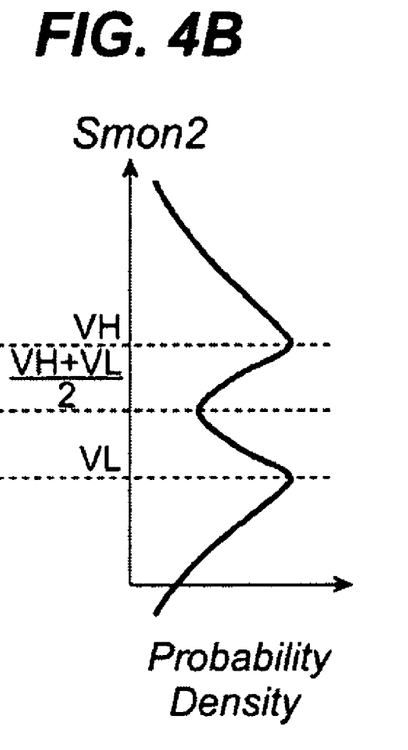

Assuming that the superposed signal Sx has the amplitude thereof with the Gaussian distribution, the monitor signal $Smon_2$, which is a sum of the monitor signal $Smon_1$ and the mixed signal Sx, $Smon_2=Smon_1+Sx$, behaves as shown in FIGS. 4A and 4B. FIG. 4A shows the time chart of the monitor signal $Smon_1$, while, FIG. 4B illustrates the amplitude distribution of the mixed signal $Smon_2$, where the amplitude distribution means the probability density for respective voltages. Mixing the superposed signal Sx having the Gaussian distribution in the amplitude thereof to the monitor signal $Smon_1$, the mixed signal $Smon_2$ entering the comparator 8 becomes, as shown in FIG. 4B, those superposing two Gaussian spectra each having a peak level at VH corresponding the high level and at VL corresponding to the low level.

The present driving circuit 1a may control the driving current Id such that the high level VH and the low level VL of the monitor signal $Smon_1$ becomes substantially equal to respective target values. FIGS. 5A to 5D describe the behavior of the monitor signal $Smon_1$ approaching the target value.

The driving circuit 1a controls the bias current Ibias based on the signal Si from the current detector 5 and the signal Si is an average of the monitor signal $Smon_1$. When the mark density ratio of the transmission signal Tx is ½, the average of the monitor signal $Smon_1$ becomes the midpoint between the high level VH and the low level VL, namely, (VH+VL)/2. That is, the driving circuit 1a controls the bias current Ibias so as to keep the average of the monitor signal $Smon_1$ constant. In other words, even the amplitude of the monitor signal $Smon_1$ widely varies, the average thereof, (VH+VL)/2, is always fixed to its target value, $(VH_0+VL_0)/2$. Specifically, the increase in the high level of the monitor signal $Smon_1$ by 1 mV by the change of the modulation current results in the decrease in the low level by 1 mV.

For the modulation current Imon, the circuit 1a operates so as to equalize two inputs, the averaged signal Save and the second reference level $V_1$, of the second comparator 10. Assuming a function $P(V_0)$ means a probability density that the binary signal Sa becomes the high level, 1 V, which is equivalent to the possibility that the mixed signal $Smon_2$ exceeds the first reference level V6, the probability density that the binary signal Sa becomes the low level, 0 V, is $1-P(V_0)$. The function $P(V_0)$ is equivalent to a hatched area from the first reference level $V_0$ to the positive infinite $+\infty$ in FIG. 5B, that is, the integration from the first reference level $V_0$ to the positive infinite $+\infty$. Thus, the average of the binary signal Sa, which is the averaged signal Save, becomes the function $P(V_0)$. The case where the averaged signal Save approaches the second reference level $V_1$ means that the function $P(V_0)$ becomes equal to the second reference level $V_1$. Specifically, when the second reference level $V_1$ is set to be 0.25 V, the driving circuit 1a controls the modulation current Imod such that the function $P(V_0)$ becomes equal to 0.25.

Figure 5A:
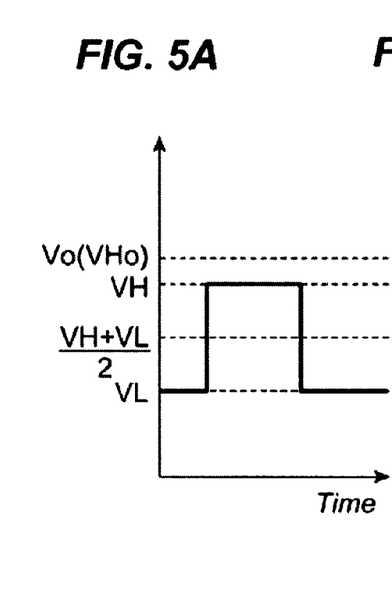
FIGS. 5A to 5D show behaviors of the monitor signal whose amplitude approaches the target value.
Figure 5B:
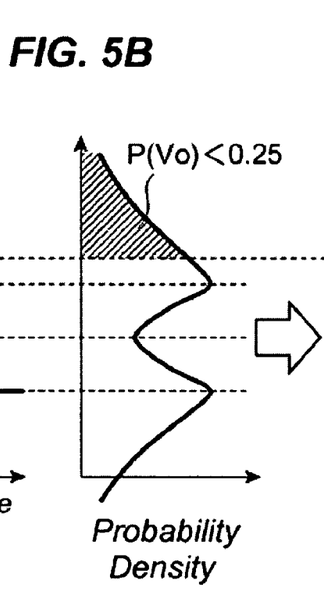

As shown in FIG. 5B, when the function $P(V_0)$ is smaller than 0.25, the averaged signal Save becomes smaller than 0.25 and the control circuit 1a increases the modulation current Imod, which increases the high level VH of the monitor signal $Smon_1$ and also the function $P(V_0)$. At the same time, the low level VL of the monitor signal $Smon_1$ decreases. Conversely, when the function $P(V_0)$ is greater than 0.25, the averaged signal Save exceeds 0.25 V, the driving circuit operates so as to decrease the modulation current Imod to approach the function $P(V_0)$ to the second reference level $V_1$, which is equal to 0.25 V.

Figure 5C:
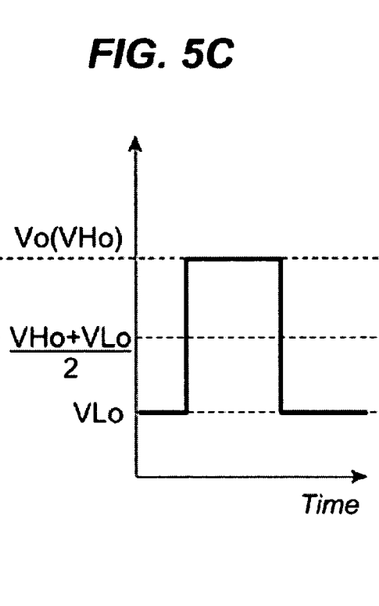
Figure 5D:
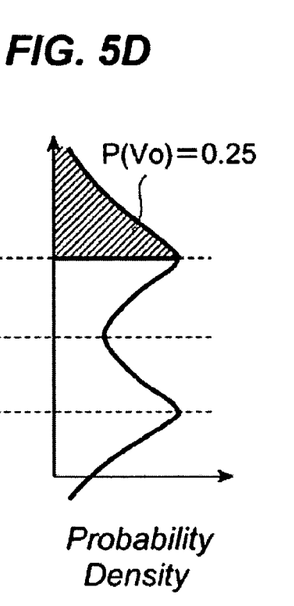

Selecting the superposed signal Sx such that the probability density of the mixed signal $Smon_2$ to exceed the first reference level $V_0$ becomes ignorable when the monitor signal $Smon_1$ is in the low level VL, the operation that the function $P(V_0)$ becomes stable at the second reference level $V_1$ (=0.25 V) as shown in FIG. 5D is equivalent to a case where the high level VH in the monitor signal $Smon_1$ is stabilized, as shown in FIG. 5C, at the value $VH_0$ corresponding to the high level at the target optical output $PH_0$. Moreover, the midpoint (VH+VL)/2 of the monitor signal $Smon_1$ is kept constant at the value $(VH_0+VL_0)/2$ by the control of the bias current Ibias, accordingly, the low level VL of the monitor signal $Smon_1$ is also stabilized at the value $VL_0$ corresponding to the target optical output $PL_0$. Thus, the driving circuit 1a controls the modulation current Imod such that the amplitude of the monitor signal $Smon_1$, VH-VL, becomes equal to the target value, $VH_0-VL_0$.

Practically, it is preferable to set the first reference level $V_0$ slightly different from the target high level $VH_0$ or the second reference level $V_1$ slightly shift from 0.25 V because the superposed signal Sx occasionally exceeds the mixed signal $Smon_2$ from the first reference level $V_0$.

Next will summarize the function of the driving circuit 1a according to the present invention. In the explanation below, the symbol D corresponds to the mark density ratio of the transmission signal Tx, (0<D<1), the symbol f(x) denotes the probability density function of the superposed signal. When the superposed signal is the white Gaussian noise, but not restricted to this function, the probability density function thereof $$f(x) = \frac{1}{\sqrt{2\pi}\,\sigma} \exp\left(-\frac{x^2}{2\sigma^2}\right) \quad (1)$$

becomes:

where $\sigma$ is the standard deviation and x is the amplitude.

Assuming that parameters v, ρ(v), and c are the voltage level of the mixed signal $Smon_2$, the probability density of respective voltages in the mixed signal $Smon_2$, and c is the average thereof, namely (VH+VL)/2, the amplitude Vx of the averaged signal Save which is the average of the binary signal Sa becomes:

$$Vx = \int_{V_o}^{\infty} \rho(v) dv \quad (2)$$

$$\rho(v) = D \cdot f(v - VH) + (1 - D) \cdot f(v - VL) \quad (3)$$
$$= D \cdot f(v - c - S) + (1 - D) \cdot f(v - c + S)$$

where S is a half of the amplitude of the mixed signal $Smon_2$, S=VH−c=c−VL. Assuming the target amplitude is $2s_0$, the second reference level $V_1$ becomes:

$$V_1 = \int_{V_o}^{\infty} \{D \cdot f(v - c - S_0) + (1 - D) \cdot f(v - c + S_0)\} dv \quad (4)$$

Thus, it is preferable to set the second reference level $V_1$ in accordance with the equation (4) above. For instance, the superposed signal Sx is the white Gaussian noise, the equation (4) above becomes;

$$V_1 = \frac{1}{2}\left\{D \cdot \text{erfc}\left(\frac{V_0}{\sqrt{2}\sigma} - c - S_0\right) + (1 - D) \cdot \text{erfc}\left(\frac{V_0}{\sqrt{2}\sigma} - c + S_0\right)\right\} \quad (5)$$

where, $$\text{erfc}(x) = \frac{2}{\sqrt{\pi}} \int_x^{\infty} \exp(-t^2) dt \quad (6)$$

To investigate the stability of the feedback loop for the control of the modulation current Imod, next will describe the response of the system for the slight change Δs of the monitor signal $Smon_1$ around the target value $s_0$. Assuming the change Δs is quite small and the amplitude in the monitor signal $Smon_1$ varies from $2s_0$ to $2(s_0-\Delta s)$, the change in the second reference level becomes:

$$\frac{Vx - V_1}{\Delta S} \doteq -D \cdot f(V_0 - c - S_0) + (1 - D) \cdot f(V_0 - c + S_0) \quad (7)$$

because the amplitude Vx is equal to the second reference level $V_1$ when the amplitude of the monitor signal $Smon_1$ is equal to $2s_0$. The closed loop gain of the driving circuit to control the modulation current Imod is necessary to take the modulation current source 32, the LD 21, the optical coupling between the LD 21 and the PD 22, and the characteristic function of the I/V-C 4 into account. Accordingly, the function f(x) that makes the right hand side of the equation (7) to be zero is quite inadequate for the superposed function Sx.

Figure 6A:
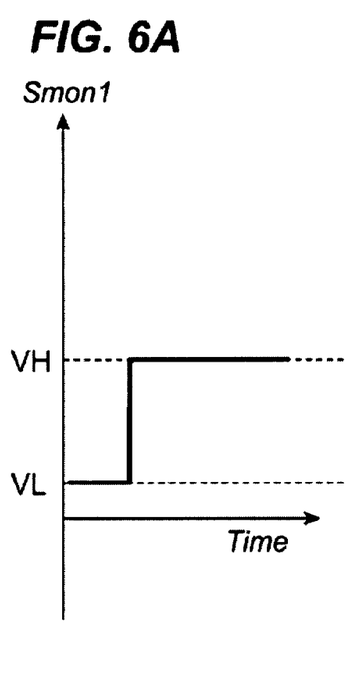
Figure 6B:
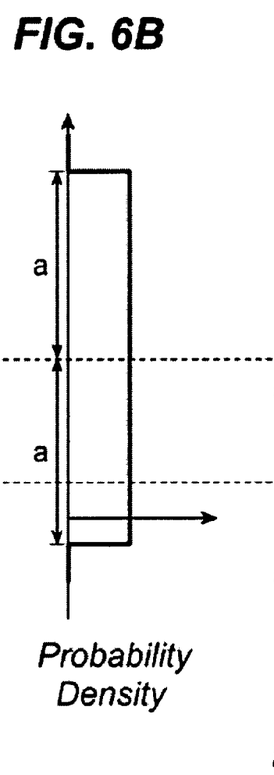
Figure 6C:
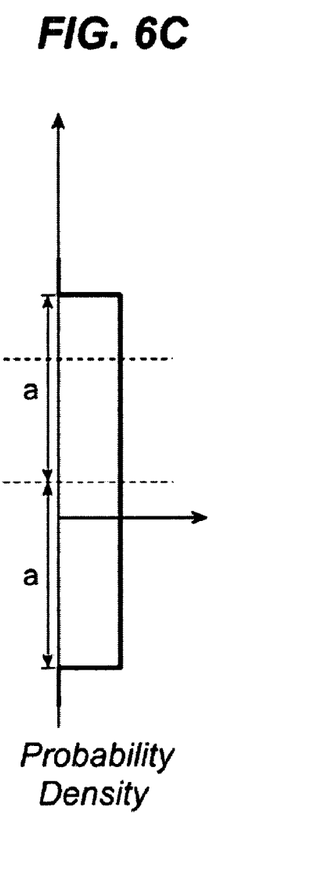

FIGS. 6A to 6C illustrates cases where an inadequate function f(x) is selected for the superposed function Sx. FIG. 6A shows the monitor signal $Smon_1$, while, FIGS. 6B and 6C illustrates the probability density of the mixed signal $Smon_2$ for the high level VH and for the low level VL, respectively. In these cases, the probability density is a uniform distribution within a preset range.

As shown in figures, when a half of the superposed function Sx, which is denoted as "a" in FIGS. 6B and 6C, is greater than the amplitude (VH−VL) of the monitor signal $Smon_1$, the distribution of the mixed signal $Smon_2$ at the high level shown in FIG. 6B and that of the low level shown in FIG. 6C partly cancels to each other to set the loop gain zero. In this case, the right hand side of the equation (7) becomes zero and such function is quite inadequate as the superposed function Sx. When the function has some distribution in the amplitude thereof, such as the Gaussian distribution, such function leaves the loop gain to be a substantial value, namely, never sets the loop gain to be zero, and is adequate as the superposed function Sx.

Figure 7A:
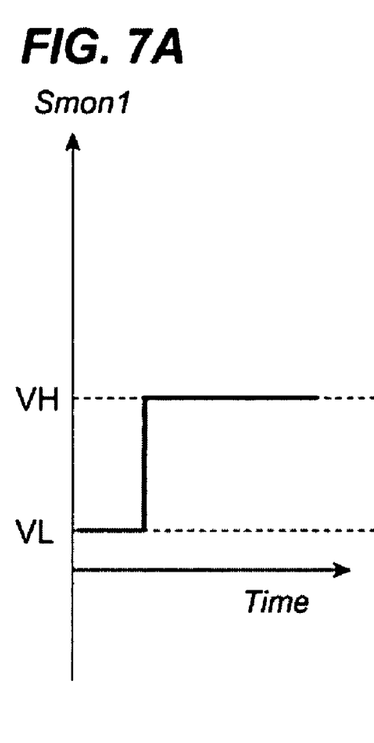
Figure 7B:
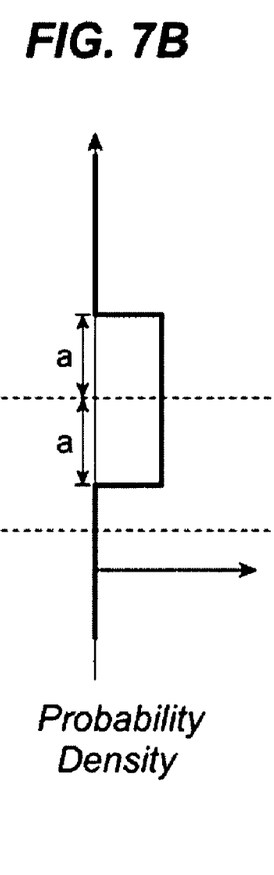
Figure 7C:
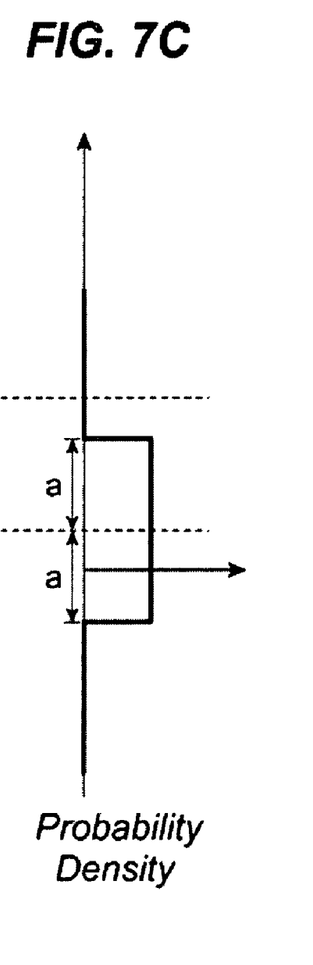

Thus, when the superposed function has a continuous and uniform distribution, it is preferable to set the range of the distribution of the function so as not to set the loop gain to be zero, as shown in FIGS. 7B and 7C, which are examples of the probability density function for the high level VH and for the low level VL, respectively. In FIGS. 7A and 7B, a half of the amplitude in the superposed function Sx, which is denoted as "a" in the figures, is set to be enough smaller than the amplitude (VH−VL) of the monitor signal $Smon_1$, which shows the substantial loop gain in the feedback control of the modulation current Imod.

Moreover, when the optical output from the LD 21 widely varies, which varies the amplitude of the monitor signal $Smon_1$, it is preferable to vary the range of the superposed function Sx and the conversion gain of the I/V-C 4 to suppress the variation in the amplitude of the monitor signal $Smon_1$.

Even when the superposed function Sx has a distribution of the triangular shape or the sine wave, the mixed signal $Smon_2$ superposes, except for the superposed signal Sx, a noise generated in the I/V-C or others. Accordingly, when the noise is large compared to the amplitude of the superposed signal, it is necessary for determining the reference levels, $V_0$ and $V_1$, to take the distribution of the noise into account in addition to that of the superposed signal Sx. When the superposed signal Sx has the Gaussian distribution in the amplitude thereof, the noise may be mixed with the superposed signal, in other words, the noise has the comparable Gaussian distribution, and the probability density of the mixed signal $Smon_2$ may be unchanged.

The adjustment of the reference levels, $V_0$ and $V_1$ may be carried out as monitoring the optical output P from the LD 21, and the evaluation based on the equation (7) above described is necessary only in the design of the driving circuit 1a. Moreover, the voltage distribution of the mixed signal $Smon_2$ reflects the overshoot and the undershoot occasionally appeared at the leading edge and the falling edge of the transmission signal Tx, the crosstalk noise and the input offset of the first comparator 8. Even when these unevaluated factors are appeared, the driving circuit 1a of the invention may suppress the influence from these factors by adjusting the reference levels, $V_0$ and $V_1$, as investigating the waveform of the optical output P from the LD 21.

The I/V-C 4 of the driving circuit 1a may be the trans-impedance amplifier or the high input-impedance amplifier with a conversion resistor in the front end thereof. The trans-impedance amplifier may enhance the conversion gain, while, the high input-impedance amplifier may suppress the input offset voltage. The superposed function Sx may be a pseudo random noise based on the pseudo-randomized signal by the digital circuit. The driving circuit 1a may further provide a cramping circuit between the I/V-C 4 and the signal mixer 6 to suppress the monitor signal $Smon_1$.

Next will compare the function of the present invention to a conventional method that directly detects the peak or bottom levels of the monitor signal, and show the function to escape the feedback control from the overshoot and the undershoot in the monitor signal. The present driving circuit 1a, because the influence of the overshoot and undershoot in the monitor signal is quite small, the adjustment of the reference levels, $V_0$ and $V_1$, may concurrently compensate these influences.

The conventional method that holds a peak level of the monitor signal within a preset period, which causes a large error in the detected peak level when the monitor signal reflects the overshoot and undershoot. On the other hand, the present driving circuit 1a adds a signal with a predetermined distribution in the level thereof and detects a period when the mixed signal exceeds a preset level, which corresponds to the integration of the probability density function in a region exceeding the reference level $V_0$, and decides whether the monitor signal is in the high level or in the low level. Accordingly, even when the monitor signal $Smon_1$ appears the overshoot or undershoot and instantaneously shows a quite high level or low level, the influence of such overshoot or undershoot may be suppressed by integrating the binary signal in the averaging unit.

Figure 8:
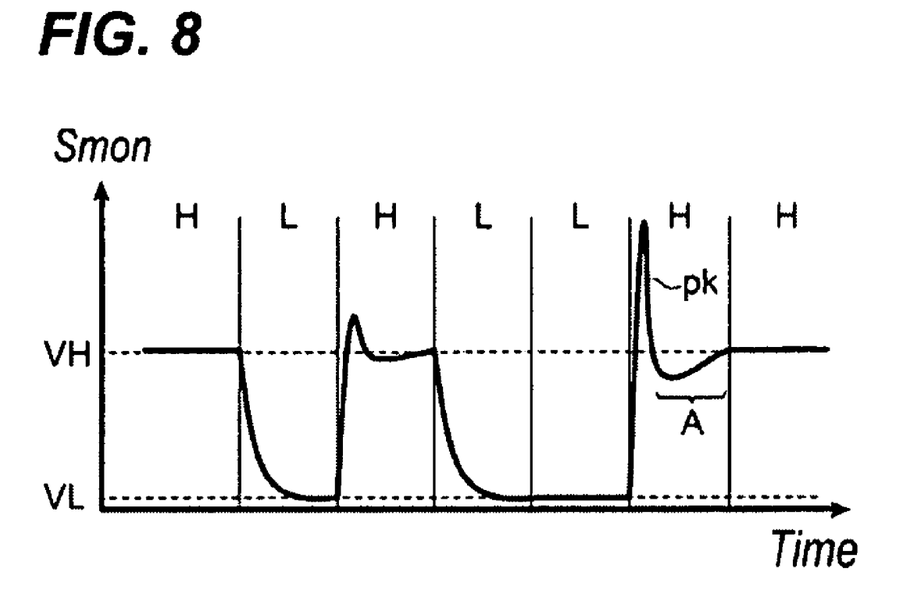
FIG. 8 illustrates typical overshoot and undershoot appeared in the monitor signal.

Moreover, not only the noise superposed on the monitor signal $Smon_1$ but also the overshoot or undershoot may be compensated to be zero by averaging it in time. FIG. 8 shows a typical example of the overshoot appeared in the monitor signal $Smon_1$. The overshoot pk, as shown in FIG. 8, causes a leading edge after the low level continues in several periods, and accompanies with a level lowered to the high level shown by a period A in FIG. 8. Thus, the averaging the monitor signal $Smon_1$ in the time dimension may compensate the influence of the overshoot and undershoot.

The function with a continuous voltage distribution, such as a triangular wave or combinations thereof, is adequate as the superposed function to compensate the influence of the overshoot and undershoot at the output Save of the averaging unit.

Next will describe why the superposed signal Sx is added to the monitor signal $Smon_1$ and the signal with the Gaussian distribution in the voltage thereof is preferable.

Figure 9A:
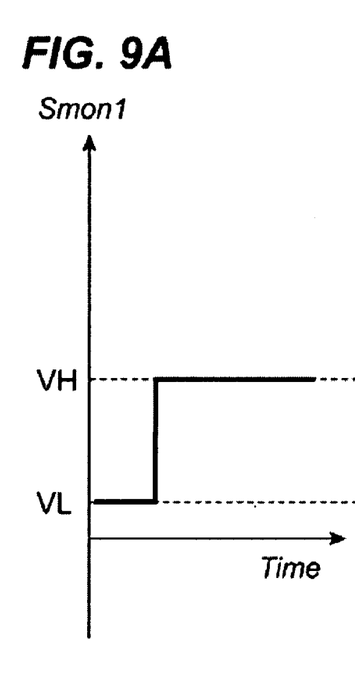
FIGS. 9A to 9C explain the voltage distribution of the monitor signal without superposing the additional signal.
Figure 9B:
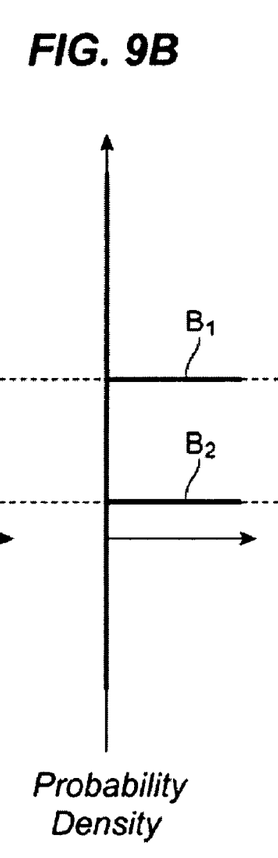
Figure 9C:
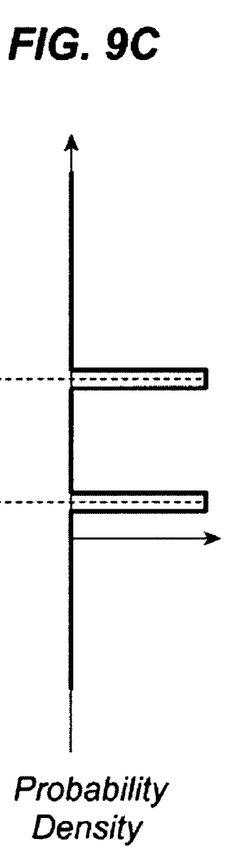

Considering a case where the signal Sx is not superposed on the monitor signal $Smon_1$. FIGS. from 9A to 9C show the level distribution of the mixed signal without superposing the signal Sx. Providing the monitor signal $Smon_1$ with the high level VH and the low level VL directly to the comparator 8, the probability density function thereof becomes those shown in FIG. 9B with two delta-functions each having the peak B1 or B2. In this case, the comparator continuously outputs, as the binary signal, the low level (0 V) when the high level VH is less than the first reference level $V_0$. Accordingly, the output Sd of the second comparator 10 becomes the maximum, the modulation current Imod increases. When the high level of the monitor signal exceeds the first reference level $V_0$, the binary signal Sa continuously outputs the high level (1V) to minimize the output Sd of the second comparator, to decrease the modulation current Imod, and to reduce the high level VH of the monitor signal $Smon_1$. Subsequently, the feedback loop iterates the operation to maximize and minimize the output Sd of the second comparator, which makes the output of the LD 21 unstable.

This unstable control is likely to appear when the superposed signal Sx has a quite narrow distribution as shown in FIG. 9C, that is, the probability distribution of the mixed signal $Smon_2$ shows a substantial value, non-zero value, only around the high level VL or the low level VL. That is, when the high level VH is close to the first reference level $V_0$ and this first reference level $V_0$ is within the narrow range of the distribution of the superposed signal, the subject above may not occur. While, the high level VH is apart from the first reference level $V_0$, the same phenomena above described may occur. Thus, when the superposed signal Sx has the uniform distribution, it is preferable to adjust the range of the distribution depending on the amplitude of the monitor signal $Smon_1$.

To superpose the signal Sx on the monitor signal $Smon_1$ and to provide thus superposed signal $Smon_2$ to the comparator 8, by integrating the binary signal Sa, may estimate the separation of the monitor signal $Smon_1$ from the first reference level $V_0$, which enables to feedback control the modulation current.

In particular, to use the signal whose amplitude has the Gaussian distribution to the superposed signal, which may be a white Gaussian noise, makes it possible that, (1) the power of the superposed signal may be optional, (2) any high level VH of the monitor signal $Smon_1$ may converge on the target level $VH_0$, and (3) the loop gain of the control shows the maximum at the target high level $VH_0$.

Thus, the driving circuit 1a of the present invention feedback controls the modulation current Imod based on the signal Save that averages the probability of the mixed signal, which is superposed with the signal Sx on the monitor signal $Smon_1$, to exceed the reference level $V_0$. Accordingly, even the monitor signal $Smon_1$ includes the overshoot and undershoot, the feedback control of the circuit 1a may suppress the influence thereof, and may precisely control the modulation current Imod.

The peak-holding circuit conventional applied to the driving circuit is easily affected by the crosstalk noise. The driving current with a scores of milliampere is typically provided to the LD to get a substantial optical output, while the photocurrent output from the monitoring PD is far smaller than the driving current, which may be a source of the crosstalk noise. This type of the crosstalk noise often occurs at the transition from the high level to the low level and from the low level to the high level of the transmission signal.

The overshoot or undershoot, and the crosstalk noise mentioned above show widely scattered influence to the monitor signal $Smon_1$. For example, the amplitude of the overshoot and undershoot depend on how the same level continues. Moreover, such subjects depend on the operation temperature of the LD. Accordingly, even the reference levels, $V_0$ and $V_1$, are adjusted during the manufacturing of the driving circuit, the influences of such subjects may not be completely compensated.

The present driving circuit 1a precisely monitors the optical output P with suppressing the influence of the noise. In particular, applying the signal Sx with the Gaussian distribution in the amplitude thereof, the circuit design becomes quite simple because the noise due to the low input impedance of the I/V-C 4 shows the same type of the Gaussian distribution. Moreover, when the noise generated by the I/V-C 4 has a specific distribution, the circuit 1a may omit the signal source 61 and the mixer 62.

The driving circuit 1a is preferable to install the terminal 15 to provide the averaged signal Save output from the averaging unit 9 to the outside. The averaged signal Save depends on the high level VH of the monitor signal $Smon_1$ not superposed with the signal Sx. Accordingly, the outside of the circuit 1a may estimate the high level VH of the monitor signal $Smon_1$ through this averaged signal Save.

(Modification of the Driving Circuit)

Figure 10:
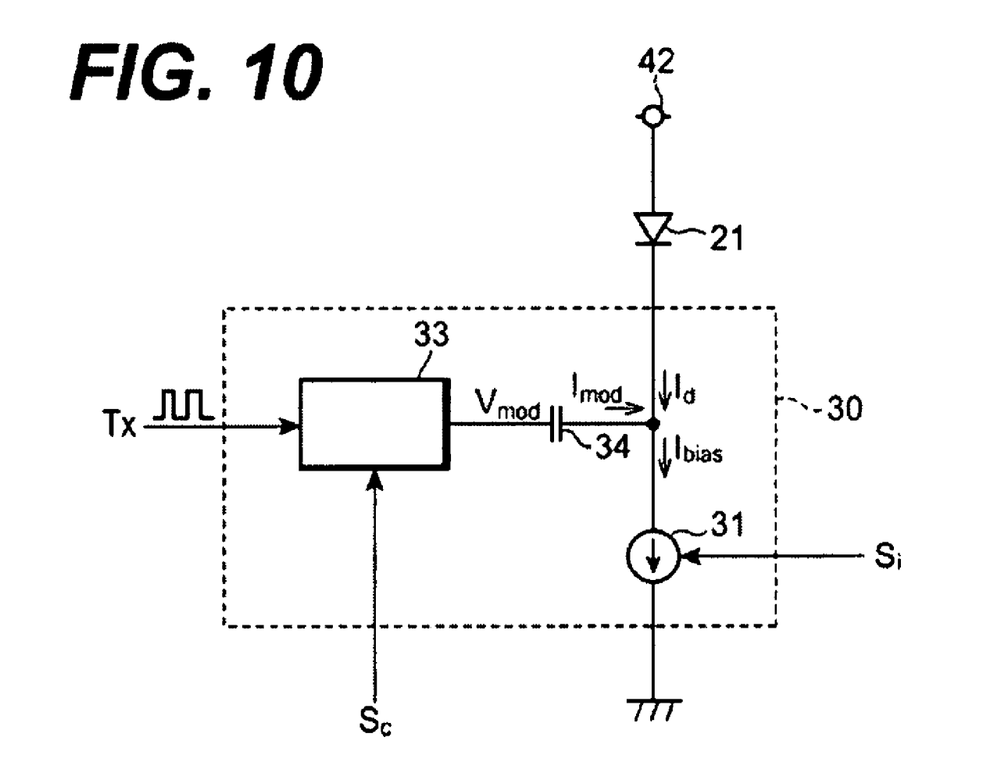
FIG. 10 shows another type of the current generator modified from the first embodiment shown in FIG. 1.

FIG. 10 shows a circuit diagram, as a modification of the embodiment shown in FIG. 1, of the current generator 30 with an AC coupled mode. The driving circuit 1a may provide this current generator 30 instead of the generator 3 illustrated in FIG. 1.

The current generator 30 provides the driving current Id, which is modified in accordance with the transmission signal Tx, to the LD 21, and provides the bias current source 31 and the modulation current source 33. The arrangement of the bias current source is the same with those shown in FIG. 1.

The modulation current source 33 receives the transmission signal Tx from the outside of the driving circuit 1a and is connected to the cathode of the LD 21 and the bias current source 31 via a capacitor 34. This arrangement provides the modulation current Imod modulated in accordance with the transmission signal Tx.

Second Embodiment

Figure 11:
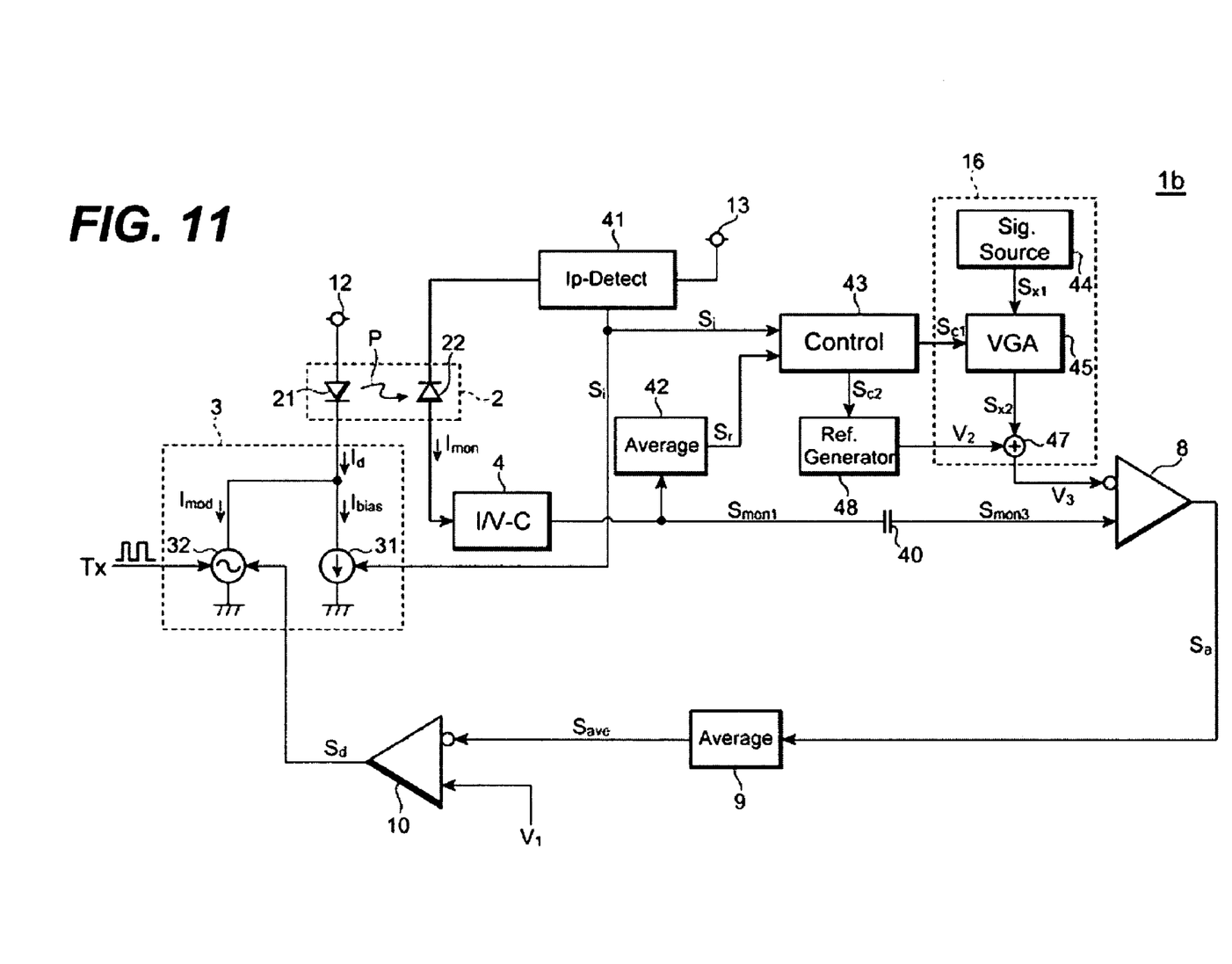
FIG. 11 is a block diagram of the laser driving circuit according to the second embodiment of the present invention.

FIG. 11 is a block diagram of the laser driving circuit 1b according to the second embodiment of the present invention. This driving circuit 1b includes, in addition to the aforementioned driving circuit 1a, a capacitor 40, a photocurrent detector 41, additional averaging unit 42, a controller 43 and the reference level generator 48.

The capacitor 40 shuts cuts the DC components contained in the monitor signal $Smon_1$ and passes only the AC components to the comparator 8. The photocurrent detector 41 generates an average of the photocurrent Imon and provides thus detected averaged signal to the bias current source 31 and the controller 43. The detector 41 may include a resistor connected between the cathode of the PD 22 and the power supply 13 and a capacitor connected between the cathode of the PD 22 and the ground. The averaged signal Si may be a voltage drop by the resistor. The averaging unit 42 detects an average of the monitor signal $Smon_1$ and provides thus detected average signal Sr to the controller 43.

The controller 43 controls, based on the conversion gain of the I/V-C 4, the power of the superposed signal $Sx_2$ in the signal mixer 16, that is, the controller 43 adjusts the average power of the super posed signal $Sx_2$ when the superposed signal $Sx_2$ has the Gaussian distribution in the amplitude thereof, while, it adjusts the range of the voltage level when the signal $Sx_2$ has the continuous distribution in the probability density thereof. Moreover, the controller 43, based on the conversion gain of the I/V-C 4, also adjust the reference level $V_3$ provided to the comparator 8. The controller, receiving the average Si of the photocurrent from the current detector 41 and the average Sr of the monitor signal $Smon_1$, estimates the conversion gain of the I/V-C 4, and outputs a first control signal $Sc_1$ depending on thus estimated conversion gain to control the power of the superposed signal $Sx_2$ and a second signal $Sc_2$ to the reference level generator 48 to adjust the reference level $V_3$.

The reference level generator 48 generates the reference level $V_2$ depending on the second control signal $Sc_2$ output from the controller 43. The present embodiment superposes the signal $Sx_2$ on the reference level $V_2$ to convert into another reference level $V_3$ with amplitude thereof having a preset probability distribution to provide the comparator 8.

The signal mixer 16 superposes the signal $Sx_2$ on the reference level $V_2$. The superposed signal $Sx_2$, similar to the signal Sx in the first embodiment, has a distribution such as the Gaussian distribution in the amplitude thereof. The signal mixer 16 includes a signal source 44, a variable gain amplifier (hereafter denotes as VGA) 45, a capacitor 46 and a mixer 47.

The signal source 44 generates a white Gaussian noise $Sx_1$ whose amplitude shows the Gaussian distribution. The VGA 45 amplifies this superposed signal $Sx_1$ by a gain determined by the first control signal $Sc_1$ provided from the controller to output the superposed signal $Sx_2$, which is superposed on the reference level $V_2$ by the mixer 47. The mixer 47 provides the reference level $V_3$ which superposes the signal $Sx_2$ on the reference level $V_2$ to the comparator 8.

The superposed signal $Sx_2$ with the amplitude thereof having the probability distribution may be superposed on, instead of the monitor signal $Smon_1$, the reference level $V_2$. The comparator 8, similar to the first embodiment, may generate the binary signal Sa, which enables the driving circuit to feedback control the modulation current Imon. Thus, the driving circuit 1b may precisely control the driving current Id of the LD 21 even the monitor signal $Smon_1$ includes the noise, or the overshoot and undershoot.

The circuit 1b shown in FIG. 11 provides the controller 43 that adjusts the average power or the voltage range of the superposed signal $Sx_2$ depending on the conversion gain of the I/V-C 4. Thus, even the conversion gain of the I/V-C 4 varies; the circuit 1b may generate the binary signal Sa corresponding to the high level of the monitor signal $Smon_1$ because the circuit 1b may optionally adjust the average power $Sx_2$ depending on the conversion gain. In particular, the superposed signal $Sx_2$ has the uniform distribution within the specific range, the circuit 1b may adjust the voltage range of the signal $Sx_2$ depending on the high level of the monitor signal $Smon_1$, because the controller 43 may adjust the amplitude of the signal $Sx_2$, which corresponds to the specific range a shown in FIGS. 7B and 7C, based on the conversion gain of the I/V-C 4.

The present embodiment varies the power of the signal $Sx_2$, namely, the average power or the voltage range thereof, depending on the conversion gain of the I/V-C, the controller 43 may adjust the power based on the average of the photocurrent Imon, or on both of the conversion gain of the I/V-C and the average of the photocurrent Imon.

The present driving circuit 1b provides the capacitor 40 between the I/V-C 4 and the comparator 8, which cancels the offset voltage attributed to the I/V-C 4 because the capacitor may cut the DC components contained within the monitor signal $Smon_1$.

While the preferred embodiments of the present invention have been described in detail above, many changes to these embodiments may be made without departing from the true scope and teachings of the present invention. The present invention, therefore, is limited only as claimed below and the equivalents thereof.

I claim:

1. A driving circuit to provide a driving current to a laser diode, the driving current being controlled based on a photocurrent generated by a photodiode that monitors an optical signal output from the laser diode, the circuit comprising:
   a signal mixer configured to output a mixed signal by mixing the photocurrent with a superposed signal;
   a comparator configured to generate a binary signal by comparing the mixed signal with a preset reference level;
   an averaging unit configured to average the binary signal, the averaging unit outputting a control signal based on the averaged binary signal; and
   a current generator configured to generate the driving current based on the control signal output from the averaging unit,
   wherein the superposed signal to be mixed with the photocurrent has amplitude with a Gaussian distribution.

2. The driving circuit according to claim 1, further comprising a current-to-voltage converter that converts the photocurrent to a monitor signal with a conversion gain; and a controller that controls the amplitude of the superposed signal based on the conversion gain of the current-to-voltage converter, wherein the comparator generates the binary signal by comparing the monitor signal with the preset reference level.

3. The driving circuit according to claim 2, further comprising a second averaging unit and a current detector, wherein the second averaging unit averages the monitor signal and the current detector outputs an average of the photocurrent, and wherein the controller calculates the conversion gain from an average of the monitor signal output from the second averaging unit and the average of the photocurrent output from the current detector.

4. The driving current according to claim 1, further comprising a current-to-voltage converter to convert the photocurrent into a monitor signal, and a controller to control the amplitude of the superposed signal based on an average of the photocurrent, wherein the comparator generates the binary signal by comparing the monitor signal with the preset reference level.

5. The driving circuit of claim 1, wherein the photocurrent follows transitions from a low level to a high level and from the high level to the low level appearing in the optical signal output from the laser diode.

6. A method for controlling a driving current supplied to a laser diode to maintain an optical output emitted from the laser diode to be constant, the method comprising steps of:
   generating a photocurrent by monitoring the optical output of the laser diode;
   mixing the photocurrent with a superposed signal to generate a mixed signal, the superposed signal having amplitude with a Gaussian distribution;
   comparing the mixed signal with a reference level by a comparator to generate a binary signal;
   averaging the binary signal to generate a control signal by an averaging unit; and
   providing the driving current based on the control signal output from the averaging unit.

7. The method according to claim 6, further comprising a step, before superposing the superposed signal, for current-to-voltage converting the photocurrent into a monitor signal with a conversion gain, wherein the step for superposing is superposing the superposed signal on one of the monitor signal and the preset reference level.

8. The method according to claim 7, further comprising a step of, before comparing the monitor signal with the preset reference level, controlling the amplitude of the superposed signal based on the conversion gain, wherein the step for comparing compares the monitor signal with the preset reference level.

9. The method according to claim 8, further comprising steps of, before controlling the amplitude of the superposed signal, averaging the photocurrent and the monitor signal, and calculating the conversion gain by comparing the average of the photocurrent and the average of the monitor signal.

10. The driving circuit of claim 6, wherein the photocurrent follows transitions from a low level to a high level and from the high level to the low level appearing in the optical output emitted from the laser diode.

* * * * *